United States Patent [19]

Arbanas

[11] Patent Number: 5,313,363

[45] Date of Patent: May 17, 1994

[54] LOW IMPEDANCE INTERCONNECTION ASSEMBLY FOR HIGH FREQUENCY SWITCHING POWER SEMICONDUCTOR DEVICES AND LOW INDUCTANCE MODULAR CAPACITOR

[75] Inventor: Zeljko Arbanas, Marlboro, Mass.

[73] Assignee: EML Research, Inc., Hudson, Mass.

[21] Appl. No.: 98,739

[22] Filed: Jul. 28, 1993

[51] Int. Cl.$^5$ ............................................... H05K 7/20
[52] U.S. Cl. ..................................... 361/710; 361/734; 361/775
[58] Field of Search ................. 174/16.3; 361/704, 707, 361/709–711, 734, 763, 775, 780, 783, 811

[56] References Cited

U.S. PATENT DOCUMENTS

| | | | |
|---|---|---|---|
| 4,755,910 | 7/1988 | Val | 361/763 |
| 4,905,123 | 2/1990 | Windle et al. | 361/775 |
| 5,053,920 | 10/1991 | Staffiere et al. | 361/775 |

Primary Examiner—Gregory D. Thompson
Attorney, Agent, or Firm—McCormick, Paulding & Huber

[57] ABSTRACT

A low impedance interconnection assembly for use with high frequency switching power semiconductor devices includes a modular capacitor, multi-layer bus structure and semiconductor switching devices assembled as a laminated unitary structure. Terminals electrically and physically connect the positive electrode of the modular capacitor to the positive DC voltage potential carried by the bus structure and the positive DC input of the semiconductor switch and other terminals electrically and mechanically couple the negative electrode of the modular capacitor to the negative DC voltage potential layer of the bus structure and the negative DC input of the switching device. The modular capacitor is made of a number of capacitor elements having their respective positive electrodes bonded to a copper foil pattern strip to define a positive electrode and their respective negative electrode terminals to a second copper foil strip to define the negative electrode. All capacitors share in supplying high slew rate current to the semiconductor switching devices to reduce losses in the capacitor.

1 Claim, 2 Drawing Sheets

LOW IMPEDANCE INTERCONNECTION ASSEMBLY FOR HIGH FREQUENCY SWITCHING POWER SEMICONDUCTOR DEVICES AND LOW INDUCTANCE MODULAR CAPACITOR

BACKGROUND OF THE INVENTION

The present invention relates generally to assemblies for the interconnection of high frequency switching power semiconductor devices and deals more specifically with an assembly for providing low impedance interconnection between high frequency switching power semiconductor devices and a low inductance modular capacitor to minimize the development of high voltage transient spikes across the semiconductor devices during rapid turn-on/turn-off switching.

Higher power switching applications such as those found in high power multi-phase DC to AC converters which generate multi-phase AC voltages for powering multi-phase motors and the like are generally limited in performance due to limitation in switching high DC currents at high frequencies to produce a desired AC voltage signal output with a desired magnitude and harmonic content. Often, the switching power semiconductor devices are subjected to voltage transient spikes during switching which, without suppression, destroy the semiconductor device. There are a number of known techniques for reducing the development of high voltage transient spikes on high frequency switching power semiconductor devices during rapid turn-on/turnoff switching. Typically, two different types of capacitors are utilized in such switching circuits to reduce the switching frequency voltage. A relatively large storage capacitor is coupled to the voltage distribution bus which supplies power to the semiconductor switching devices. This capacitor provides low frequency current filtering. Smaller, fast switching capacitors are located in as close proximity as possible to the semiconductor switching devices to filter high amplitude transient currents which occur during the switching process. The smaller faster switching capacitors are characterized by a high current handling capacity and typically are either coupled directly to the DC voltage power bus or form a part of various snubber circuits which are coupled to the semiconductor switching devices and which snubber circuits and techniques are well known to those skilled in the art.

It is desirable therefore to reduce the time and effort required to assemble and interconnect high frequency switching power semiconductor devices and current filtering and voltage transient suppression devices.

It is a general aim of the present invention therefore to provide a packaging assembly which facilitates a low impedance interconnection between high frequency switching power semiconductor devices and low inductance capacitors and a DC voltage potential applied to and switched by the semiconductor devices.

It is a further aim of the present invention to provide a low impedance modular capacitor for use with the assembly of the present invention.

SUMMARY OF THE INVENTION

In accordance with the present invention, a low impedance interconnection assembly for use with high frequency switching power semiconductor devices includes a heat sink mounting plate upon which a plurality of high frequency switching powers semiconductor devices are mounted. A multi-layer planar bus structure is in facing relationship with the semiconductor devices and carries positive and negative DC voltage potentials. At least one modular capacitor is in facing contact with the upper surface of the multi-layer bus structure and includes at least one positive electrode connection means and at least one negative electrode connection means. At least one electrical coupling means couples the positive electrode of the modular capacitor to the positive DC potential layer of the bus structure and the positive DC voltage input of the semiconductor device. A second electrical coupling means couples the negative electrode of the modular capacitor to the negative DC voltage potential layer of the bus structure and the negative DC voltage input of the semiconductor device. The electrical coupling means also function to mechanically hold the modular capacitor, multi-layer bus structure and semiconductor switching devices in a laminated assembly.

The invention further resides in the modular capacitor being made of a plurality of standard foil or film wound enclosureless capacitor elements or alternatively multi-layer ceramic capacitor elements, packaged side-by-side and edge-to-edge with the negative terminals of each of the capacitor elements being connected to a copper foil pattern strip which provides a large current carrying surface area. Metallic conductive material encloses the periphery of the capacitor element and is bent over the top and electrically bonded to the positive electrode terminations of the capacitor element and forms a contact and attachment surface for a second copper foil pattern strip. Positive polarity connection studs are bonded by wire to the foil jackets of adjacent capacitor elements. A negative polarity stud is electrically wired to the negative copper foil pattern strip. The copper foil pattern strip provide a low inductance in the region of the electrode terminations for handling the high slew rate currents during switching. The capacitor element exhibits a higher inductance towards the center region and aids in carrying low frequency switching currents.

BRIEF DESCRIPTION OF THE DRAWINGS

Other features and advantages of the present invention will become readily apparent from the following written description and drawings wherein.

WRITTEN DESCRIPTION OF PREFERRED EMBODIMENTS

Figure 1:
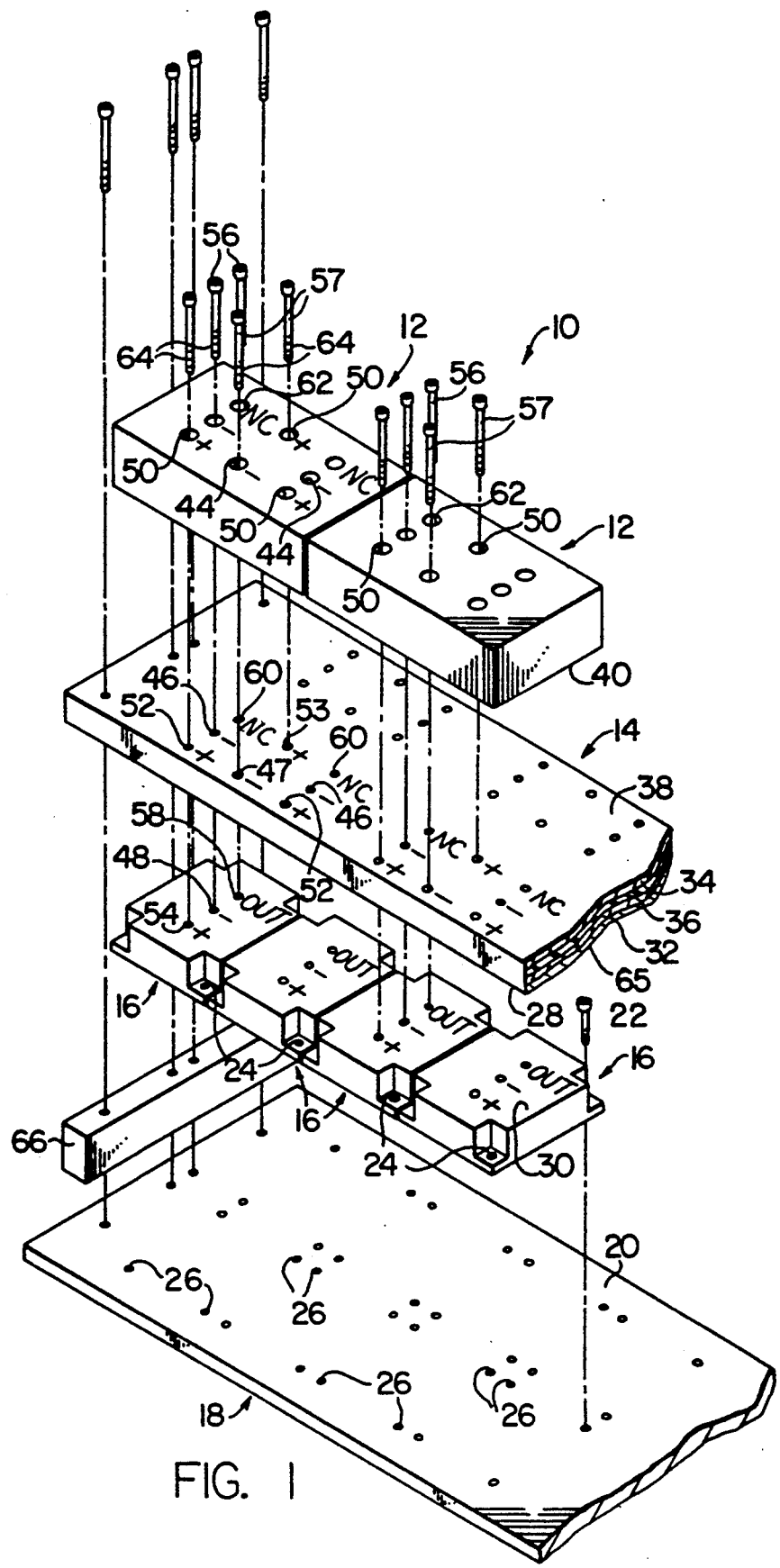
FIG. 1 is an exploded view of the low impedance interconnection laminated assembly for high frequency switching power semiconductor devices showing the alignment of the modular capacitor, parallel plane DC voltage bus structure, power semiconductor switching devices and heat sink mounting plate.

Turning now to the drawings and considering FIG. 1, the low impedance interconnection laminated assembly comprising the present invention is schematically illustrated therein as an exploded view and is generally designated 10. The component parts when fully assembled are sandwiched and provide a unitary structure and as shown in FIG. 1 represent two phases or poles of a multi-pole DC to AC converter and the like. The component parts of the assembly 10 comprise a modular capacitor generally designated 12, a parallel plane voltage distribution bus 14, high frequency switching power semiconductor devices 16,16 and a heat sink or mounting plate 18. The heat sink or mounting plate 18 has a surface 20 upon which the semiconductor power switching devices 16,16 are held thereto by means of screws 22,22 or other suitable attaching means. Mounting holes 24,24 pass through the semiconductor device packages to receive the screws 22,22 and in the illustrated embodiment are shown passing through shoulder portions in the respective corners of the semiconductor switching device packages. The heat sink 18 has a number of pre-spaced and positioned holes 26,26 in the surface 20 which are in registration with the respective holes 24,24 of the semiconductor switching device packages when the devices are located on the heat sink. The holes 26,26 are tapped to accept the screw thread of the respective screws 22,22 to securely hold the semiconductor switching device 16 to the heat sink 18 when the screws are screwed in. As so assembled, the heat sink 18 absorbs and dissipates heat produced by the semiconductor power switching devices 16,16.

A laminated or multi-layer parallel plane bus structure 14 is used to provide DC voltage distribution to the semiconductor power switching devices. The bus structure 14 has a substantially flat outwardly facing lower surface 28 which comes into contact with the upper surface 30 of the semiconductor power switching device packages 16,16. The bus structure 14 may have a number of voltage potential carrying and ground reference potential layers, each layer being separated physically and electrically insulated by a dielectric layer 36. In the illustrated embodiment, layer 32 carries a DC voltage potential of a first polarity, layer 34 carries a DC voltage of an opposite polarity and a dielectric layer 36 which is sandwiched between layers 32 and 34 to provide electrical insulation between the two DC voltage potential layers.

The bus structure 14 includes a number of holes passing therethrough from an outwardly facing upper surface 38 through the layers 32, 34 and 36 through to the opposite outwardly facing lower surface 28. As will become apparent, the holes are in registration with corresponding nuts in the surface 30 of the high frequency semiconductor power switching device packages and which nuts serve as electrical connections to the semiconductor switching devices.

The modular capacitor 12 has a substantial flat outwardly facing lower surface 40 which is in contact with the parallel plane bus structure surface 38 when the assembly 10 is completed. The modular capacitor 12 includes a number of holes passing therethrough and which holes are in alignment and registration with like polarity holes in the parallel plane bus structure 14 and the connection nuts in the high power semiconductor switching devices 16. In the illustrated embodiment, holes identified as having a negative polarity in the modular capacitor 12 are designated 44,44 and which are in corresponding registration with negative polarity holes 46,46 in the parallel plane bus structure 14 and with the negative polarity connection nut or input 48 in the semiconductor power switching device 16. Holes identified as having a positive polarity in the modular capacitor 12 are designated 50,50 and which are in corresponding registration with positive polarity holes 52,52 in the parallel plane bus structure 14 and with the positive polarity connection nut or input 54 in the high power semiconductor switching device 16.

A plurality of shoulder bushing terminals 56,56 are used to provide an electrical and physical connection by interconnecting the respective capacitor electrodes to the proper polarity voltages carried by the bus structure 14 and to the semiconductor switching devices 16 and are also used to fasten the unit together. In the illustrated embodiment, the shoulder bushing terminal 56 has a threaded portion 64 which is screwed into the corresponding threaded nut 48, 54, 58 of the semiconductor switching device. This relatively simple connection not only accelerates and simplifies the assembly of the apparatus during manufacturing but also provides a number of electrical benefits as will become apparent below.

The shoulder bushing terminal 56 passes through a hole 44,50 in the modular capacitor and is in electrical physical contact with a respective negative or positive electrode of the modular capacitor and is selectively connected to either a positive or negative polarity DC voltage bus layer 32,34 in the parallel plane bus structure 14 to provide the proper polarity voltage connection between the electrodes of the modular capacitor 12 and the positive DC voltage input 54 and negative DC voltage input 48 respectively of the high power semiconductor switching device 16. The layered bus structure is of a conventional design wherein alternating holes in registration allow the passage of the bushing terminal through one layer but in contact with the other layer. The design also takes creepage into consideration to prevent short circuiting between layers.

A shoulder bushing 56 is also used to provide an electrical and physical connection to the AC output connection nut 58 of the high frequency power switching semiconductor devices. In the illustrated embodiment, the output of the high frequency power semiconductor switching device is in registration with a non-connection passthrough hole 60 in the parallel plane bus structure 14 and a non-connection passthrough hole 62 in the modular capacitor 12 to provide an electrical and physical output connection point from the semiconductor switching device. In an actual embodiment, the shoulder bushing terminals are recessed within the modular capacitor package.

Figure 2:
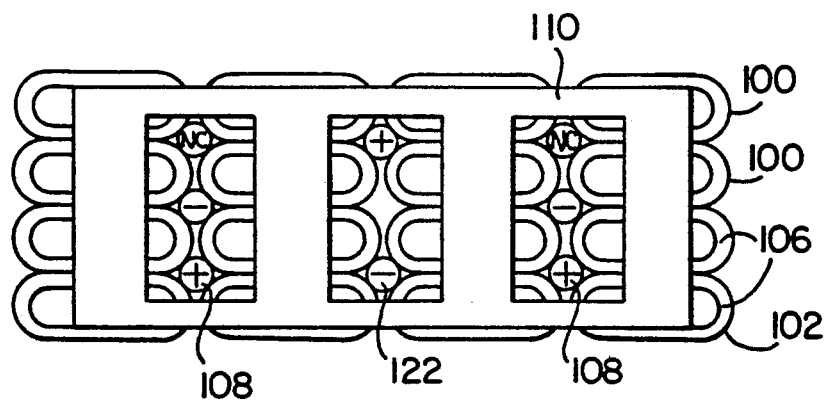
FIG. 2 is a top plan schematic view of the modular capacitor of FIG. 1 showing the capacitor with the enclosure removed.
Figure 3:
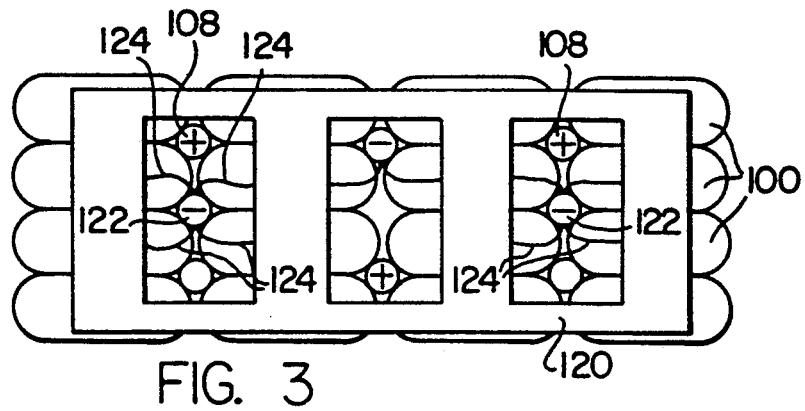
FIG. 3 is a bottom plan schematic view of the modular capacitor of FIG. 1 showing the capacitor with the enclosure removed.
Figure 4:
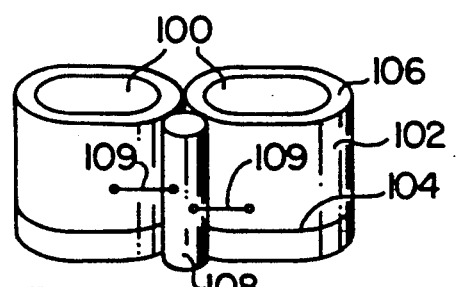
FIG. 4 is a side elevation view showing the connection of two wound foil capacitor elements of the modular capacitor wired to a voltage polarity connection stud through which a shoulder bushing terminal passes to make contact therewith.

The modular capacitor of FIG. 1 is shown somewhat schematically in the top plan view of FIG. 2, the bottom plan view of FIG. 3 and the side elevation view of FIG. 4 to reveal the novel and innovative packaging which provides the low internal series inductance and low internal series resistance of the modular capacitor. The modular capacitor is formed by packaging a plurality of standard foil of film wound enclosure less capacitor elements 100,100 vertically into an enclosure. The foil/film wound capacitor elements are inserted vertically into the enclosure housing in either the standard cylindrical configuration or as illustrated in FIGS. 2–4 as a flatten oval. As illustrated in FIG. 4, the capacitor elements 100,100 are enclosed in a copper foil jacket 102 which does not completely cover the outer peripheral surface area of the capacitor element but extends from a lower portion generally designated 104 to the top 106 of the capacitor element 100 and is bent or folded over to provide a covering surface and a physical and electrical connection point to which the film/foil of the capacitor element is attached using conventional bonding methods well known to those skilled in the art to define one electrode of the capacitive element 100. The copper foil jacket 102 is electrically connected to a positive polarity stud 108 which is electrically bonded to the copper foil jacket 102 by wires 109,109 connected between the stud 108 and the surface of the copper foil jacket 102 as close as possible to the lower end 104 of the foil jacket. As shown in FIGS. 2 and 3, the capacitor elements 100,100 are in a side-by-side and edge-to-edge physical arrangement and the copper foil jacket 102 of adjacently located capacitor elements 100,100 are also bonded to the stud 108. This connection pattern is duplicated for all the capacitor elements. An "I"-shaped copper foil pattern strip 110 provides a large surface area along the web of the "I" for carrying current and is electrically connected to the copper foil jacket 102 along the top surface 106 using well known methods to electrically interconnect together all the positive polarity electrodes of the capacitor elements 100,100.

A second "I"-shaped copper foil pattern strip 120 is electrically connected to the negative electrode of the capacitor elements 100,100 to electrically interconnect together the negative electrodes of all the capacitor elements 100,100. The copper foil pattern strip 120 is bonded to the terminals of the negative electrodes of the capacitor elements 100,100 using bonding techniques well known to those skilled in the art. As in the case of the positive polarity studs, the negative polarity studs are interposed vertically between adjacent capacitor elements 100,100 and each negative polarity stud 122 is electrically connected to the copper foil pattern strip 120 via conductive wires 124,124 which have one end electrically connected to the negative polarity stud 122 and its opposite end electrically bonded to the copper foil strip 120.

The copper foil pattern strips 110 and 120 create a zone of low inductance in the region closest to the foil of the capacitor elements 100,100 so that a significant portion of each capacitor element has a relatively low inductance region which is used to deliver high slew rate switching currents. The central region of the capacitor element 100 has a higher inductance, but is still effective in filtering the low frequency currents developed in the switching of the semiconductor devices.

The capacitor elements 100,100 together with the copper foil pattern strips 110,120 and polarity studs 108,108 and 122,122 are encapsulated with an epoxy filler or other suitable filler for encapsulation and which fillers are well known to those skilled in the art.

The direct connection of the shoulder bushing terminal from the positive and negative polarity electrodes of the modular capacitor to the respective negative and positive terminals of the high frequency switching power semiconductor devices permit the immediate supply of the high slew rate currents required by the semiconductor switching devices. Since all the capacitor elements 100,100 are connected directly to the low inductance parallel plane bus structure 14 by means of the shoulder bushing terminals, the capacitor elements making up the modular capacitor have a low impedance path to every high frequency switching power semiconductor device. The result of the direct connection of all the capacitors to every semiconductor switching device means that the high slew rate current required by any one of the switching devices during the switching process is delivered by all the capacitors. Because the semiconductor power switching devices do not all switch at the same time, the current sharing among all the capacitor elements of all the modular capacitors assembled results in reduced loss in the capacitors and these losses are N times lower than in the case were the same number of N capacitors supply current to only their own semiconductor switching devices.

Shoulder bushing terminals 57,57 are slightly shorter than terminals 56,56 and are used to connect the respective positive and negative electrodes of the modular capacitor to the respective positive and negative DC voltage polarity layers of the parallel bus structure 14. As shown, the positive polarity voltage connection is at hole 53 and the negative polarity voltage connection is at hole 47. The supplementary connection provided to the modular capacitor achieves further reduction of equivalent series inductance of the entire modular capacitor as measured from the DC voltage bus structure; provides further reduction of equivalent series resistance of the capacitor and further reduces as a result of additional mechanical attachment of the modular capacitor to the bus structure 14 the susceptibility of the modular capacitor to shock and vibration.

Optionally, one or more electrically isolated parallel thermal plane(s) 65 can be located adjacent to one or more of the electrical layers. These thermal planes are made of a thermally conductive material. The purpose of this plane or planes is to conduct heat out of the interconnection layers and/or the attached components.

Heat is conducted along the thermal plan to bushings 67 distributed along the thermal plane. The bushings are also made of thermally conductive material, and are attached to the thermal plane by thermally conductive joints, for example, by brazing. The bushings serve to carry heat from the thermal plane to mechanical support structures 66, which in turn carry the heat to the heat sink mounting plate.

Figure 5:
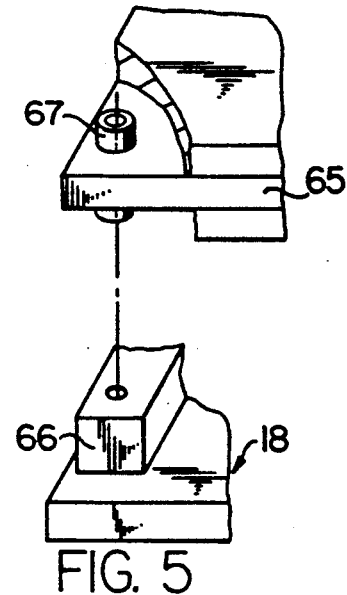
FIG. 5 is an exploded view of a shoulder bushing terminal used with the invention.

In FIG. 5, an exploded detail of one bushing 67 is shown. A corner of the interconnection assembly has been shown cut away at all levels except the level of the thermal plane 65, to more clearly illustrate the bushing.

A low impedance interconnection laminated assembly for connecting high frequency switching power semiconductor devices to a DC voltage power source and modular capacitor has been described above in a preferred embodiment. Numerous changes and modifications may be made to the embodiments described without departing from the spirit and scope of the invention and therefore the invention has been described by way of illustration rather than limitation.

The invention claimed:

1. A low impedance interconnection assembly for use with high frequency switching power semiconductor devices, said assembly comprising:
a heat sink mounting plate having an outwardly facing substantially flat surface;
a plurality of semiconductor switching devices having along an outwardly facing upper surface a means forming a positive polarity DC voltage input, means forming a negative polarity DC voltage input and means forming AC voltage output; and an outwardly facing lower surface having means for attachment to said heat sink mounting plate;

means forming a multi-layer planar bus structure having an outwardly facing lower surface in contact with said outwardly facing upper surface of said semiconductor switching devices, an outwardly facing upper surface, a first layer carrying a positive DC voltage potential, a second layer, carrying a negative DC voltage potential, a dielectric layer separating said first and second layers and a thermal layer of conductive material dielectrically isolated from said first and second layers;

at least one modular capacitor having at least one positive electrode connection means and at least one negative electrode connection means, said modular capacitor having an outwardly facing lower surface in contact with said outwardly facing upper surface of said multi-layer bus structure;

first means for electrically coupling said modular capacitor positive electrode to said first layer of said multi-layer bus structure and said semiconductor positive polarity DC voltage input means;

second means for electrically coupling said modular capacitor negative electrode to said second layer of said multi-layer bus structure and said semiconductor negative polarity DC voltage input means;

said first and second electrical coupling means further forming attachment means for holding said modular capacitor, multi-layer bus structure and said semiconductor switching devices in a laminated assembly;

thermally conductive means for mechanically connecting the thermal layer of said multi-layer bus structure to said heat sink mounting plate.

* * * * *